(12) United States Patent
Morikawa

(10) Patent No.: US 10,014,449 B1
(45) Date of Patent: Jul. 3, 2018

(54) LIGHT EMITTING DEVICE

(71) Applicant: NICHIA CORPORATION, Anan-shi, Tokushima (JP)

(72) Inventor: Takeshi Morikawa, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/848,695

(22) Filed: Dec. 20, 2017

(30) Foreign Application Priority Data

Dec. 21, 2016 (JP) ................. 2016-248524

(51) Int. Cl.
| | | |
|---|---|---|
| *H01J 1/62* | (2006.01) | |
| *H01L 33/50* | (2010.01) | |
| *H01L 25/075* | (2006.01) | |
| *G02F 1/1335* | (2006.01) | |
| *H01L 33/48* | (2010.01) | |
| *F21V 8/00* | (2006.01) | |
| *C09K 11/08* | (2006.01) | |
| *H01L 33/56* | (2010.01) | |
| *H05B 33/04* | (2006.01) | |
| *F21Y 115/10* | (2016.01) | |

(52) U.S. Cl.
CPC ........ *H01L 33/504* (2013.01); *C09K 11/0883* (2013.01); *G02B 6/0068* (2013.01); *G02F 1/133603* (2013.01); *H01L 25/0753* (2013.01); *H01L 33/486* (2013.01); *H01L 33/508* (2013.01); *H01L 33/56* (2013.01); *F21Y 2115/10* (2016.08); *H01L 33/505* (2013.01); *H01L 33/507* (2013.01); *H05B 33/04* (2013.01)

(58) Field of Classification Search
USPC .......................... 313/503, 498, 506
See application file for complete search history.

(56) References Cited

U.S. PATENT DOCUMENTS

| | | |
|---|---|---|
| 2007/0194333 A1 | 8/2007 | Son |
| 2009/0097240 A1* | 4/2009 | Egawa .............. G02F 1/133603 362/231 |
| 2010/0213475 A1 | 8/2010 | Son |
| 2010/0258823 A1 | 10/2010 | Son |

(Continued)

FOREIGN PATENT DOCUMENTS

| | | |
|---|---|---|
| JP | 2002-329587 A | 11/2002 |
| JP | 2007-207834 A | 8/2007 |

(Continued)

*Primary Examiner* — Vip Patel

(57) ABSTRACT

A light emitting device includes a first light emitting element configured to emit red light, a second light emitting element configured to emit green light, a third light emitting element configured to emit blue light, and a translucent member covering the first, second and third light emitting elements. The translucent member includes a wavelength conversion substance configured to absorb the blue light of the third light emitting element and to emit light. The first light emitting element, the second light emitting element, and the third light emitting element are connected in series. At the same forward current value, a radiant flux of the third light emitting element is greater than a radiant flux of the first light emitting element and a radiant flux of the second light emitting element. The wavelength conversion substance includes a phosphor material configured to emit light having a color between green and red.

7 Claims, 4 Drawing Sheets

(56) References Cited

U.S. PATENT DOCUMENTS

| | | |
|---|---|---|
| 2011/0278602 A1 | 11/2011 | Kondo |
| 2011/0291154 A1 | 12/2011 | Noichi et al. |
| 2013/0270586 A1 | 10/2013 | Son |
| 2015/0028373 A1 | 1/2015 | Abe et al. |
| 2015/0153504 A1 | 6/2015 | Cho et al. |
| 2015/0235997 A1 | 8/2015 | Son |

FOREIGN PATENT DOCUMENTS

| | | |
|---|---|---|
| JP | 2007-227925 A | 9/2007 |
| JP | 2009-099334 A | 5/2009 |
| JP | 2010-186814 A | 8/2010 |
| JP | 2011-238879 A | 11/2011 |
| JP | 2012-134564 A | 7/2012 |
| JP | 2014-060443 A | 4/2014 |
| JP | 2015-026698 A | 2/2015 |
| JP | 2015-109418 A | 6/2015 |
| WO | 2006-059828 A1 | 6/2006 |
| WO | 2012-046661 A1 | 4/2012 |

\* cited by examiner

LIGHT EMITTING DEVICE

CROSS-REFERENCE TO RELATED APPLICATIONS

This application claims priority to Japanese Patent Application No. 2016-248524, filed on Dec. 21, 2016. The entire disclosure of Japanese Patent Application No. 2016-248524 is hereby incorporated herein by reference.

TECHNICAL FIELD

The present invention relates to a light emitting device.

BACKGROUND ART

For example in International Patent Publication No. WO2012/046661, described is a light emitting device that includes one package, a red LED, a green LED, and a blue LED arranged inside the package, and a translucent sealing resin part arranged inside the package so as to cover the three color LEDs, and the package is made including phosphor that emits light that is excited by light emitted from the blue LED.

Also, in Japanese Laid-Open Patent Application Publication No. 2009-099334 which is listed a prior art document to Patent Document 1, described is synchronization of color information of three primary colors of an image displayed on an image display panel, and dynamic control of supplying of power respectively to the red LED, the green LED, and the blue LED.

SUMMARY

With the aforementioned prior art light emitting device, even when it is possible to obtain excellent color reproducibility, to do dynamic control of the supplying of power respectively to the three color LEDs, it is necessary to have at least four external connection terminals, making the configuration of the drive circuit complex.

In light of that, the purpose of an embodiment of the present invention is to provide a light emitting device with excellent color reproducibility, for which a minimum of two external connection terminals for power feeding is sufficient.

A light emitting device according to an embodiment includes a first light emitting element configured to emit red light, a second light emitting element configured to emit green light, a third light emitting element configured to emit blue light, and a translucent member covering the first, second and third light emitting elements. The translucent member includes a wavelength conversion substance configured to absorb the blue light of the third light emitting element and to emit light. The first light emitting element, the second light emitting element, and the third light emitting element are connected in series. At the same forward current value, a radiant flux of the third light emitting element is greater than a radiant flux of the first light emitting element and a radiant flux of the second light emitting element. The wavelength conversion substance includes a phosphor material configured to emit light having a color between green and red.

With one embodiment of the present invention, obtained is a light emitting device with excellent color reproducibility, for which a minimum of two external connection terminals for power feeding is sufficient.

DETAILED DESCRIPTION OF EMBODIMENTS

Embodiments of the invention are explained hereafter while referring to drawings as appropriate. However, the light emitting devices explained hereafter are for embodying the technical concepts of the present invention, and unless specifically noted, the present invention is not limited to the items below. Also, the contents explained in one embodiment and working example can also be applied to other embodiments and working examples. Also, the size, positional relationship, etc., of the members shown in each drawing may be exaggerated to clarify an explanation.

The wavelength of the visible wavelength region is in a range of 380 nm-780 nm, the wavelength of the blue region is in a range of 420 nm-480 nm, the wavelength of the green region is in a range of 500 nm-560 nm, the wavelength of the yellow region is in a range longer than 560 nm and 590 nm or less, the wavelength of the orange region is longer than 590 nm and shorter than 610 nm, and the wavelength of the red region is 610 nm-750 nm.

Embodiment 1

Figure 1A:
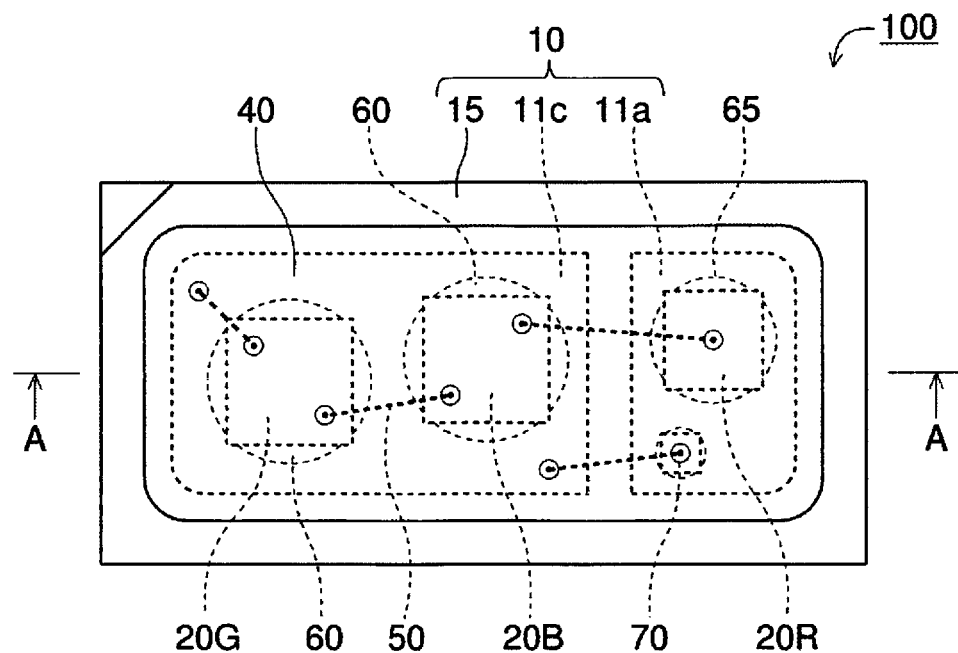
FIG. 1A is a schematic top view of a light emitting device of an embodiment 1 of the present invention.

FIG. 1A is a schematic top view of a light emitting device 100 of embodiment 1.

Figure 1B:
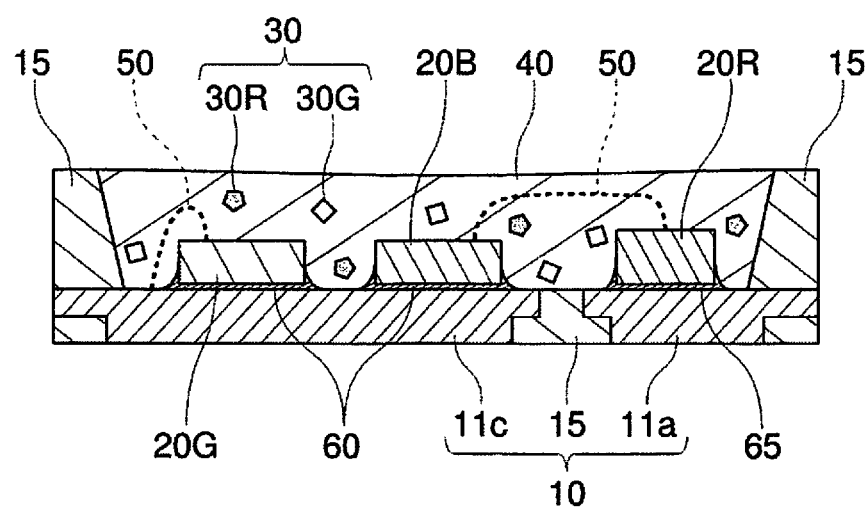
FIG. 1B is a schematic cross section view of the light emitting device taken along a line A-A in FIG. 1A.
Figure 1C:
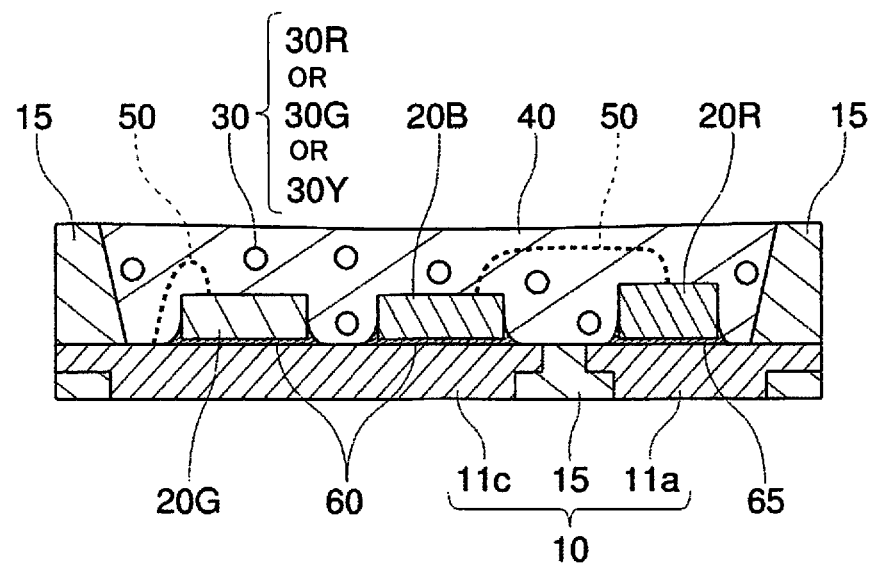
FIG. 1C is a schematic cross section view showing another example of the configuration of a wavelength conversion substance for the light emitting device of the embodiment 1 of the present invention.
Figure 1D:
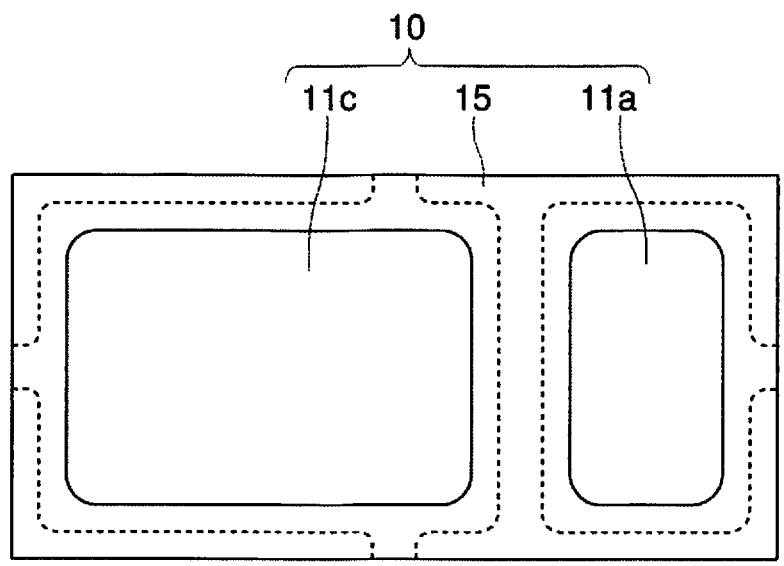
FIG. 1D is a schematic bottom view of the light emitting device of the embodiment 1 of the present invention.

FIG. 1B is a schematic cross section view of cross section A-A in FIG. 1A. FIG. 1C is a schematic cross section view showing another example of a configuration of a wavelength conversion substance of the light emitting device 100. FIG. 1D is a schematic bottom view of the light emitting device 100.

As shown in FIG. 1A to 1D, the light emitting device 100 of embodiment 1 is provided with a first light emitting element 20R for emitting red light, a second light emitting element 20G for emitting green light, a third light emitting element 20B for emitting blue light, and a translucent member 40. The first light emitting element 20R, the second light emitting element 20G, and the third light emitting element 20B are connected in series. The translucent member 40 covers the first light emitting element 20R, the second light emitting element 20G, and the third light emitting element 20B.

The translucent member 40 includes a wavelength conversion substance 30 that absorbs light of the third light emitting element 20B and emits light. Also, the wavelength conversion substance 30 is a phosphor that emits from green to red light.

In more detail, the light emitting device 100 is further provided with a base 10. The base 10 is a package for a surface mount type light emitting diode. The base 10 is provided with a first lead electrode 11a, a second lead electrode 11c, and a resin molded body 15. The resin molded body 15 holds the first lead electrode 11a and the second lead electrode 11c. The base 10 has a recess for which the bottom surface becomes an element mounting surface. A portion of the recess bottom surface the base 10 is configured by the surface of the first lead electrode 11a and the surface of the second lead electrode 11c. The first light emitting element 20R, the second light emitting element 20G, and the third light emitting element 20B are mounted on the element mounting surface of the base 10. The second light emitting element 20G and the third light emitting element 20B are adhered to each element mounting surface with an electrically insulating adhesive member 60, and the first light emitting element 20R with an electrically conductive adhesive member 65. Also, the first light emitting element 20R and the third light emitting element 20B, as well as the second light emitting element 20G and the third light emitting element 20B, are connected to each other in series by a wire 50. The first light emitting element 20R is connected by the adhesive member 65 to the first lead electrode 11a that becomes a positive electrode terminal. The second light emitting element 20G is connected by the wire 50 to the second lead electrode 11c that becomes a negative electrode terminal. The translucent member 40 is filled inside the recess of the base 10.

Such a light emitting device 100 is a semiconductor light emitting element for which the first light emitting element 20R, the second light emitting element 20G, and the third light emitting element 20B each have a narrower spectral line width than that of the emitted light of the phosphor, so it has very excellent color reproducibility. Also, with the light emitting device 100, the first light emitting element 20R, the second light emitting element 20G, and the third light emitting element 20B are connected in series, so a minimum of two external connection terminals for power feeding, specifically, one positive electrode terminal and one negative electrode terminal, is sufficient. Thus, it is possible to have a simple configuration for the drive circuit of the light emitting device 100.

At the same forward current value, the radiant flux of the third light emitting element 20B is greater than the radiant flux of the first light emitting element 20R, and is greater than the radiant flux of the second light emitting element 20G. When this kind of first light emitting element 20R, second light emitting element 20G, and third light emitting element 20B are connected in series, forward current of the same value flows to the first light emitting element 20R, the second light emitting element 20G, and the third light emitting element 20B, and the third light emitting element 20B emits light of the greatest radiant flux. In light of that, by a portion of the blue light emitted by the third light emitting element 20B being absorbed by the wavelength conversion substance 30, it is possible to balance the radiant flux of each color, red, green, and blue, of the light emitting device 100. Also, the radiant flux of the light of the green region and the red region emitted by the wavelength conversion substance 30 can be added as the radiant flux of the first light emitting element 20R and the second light emitting element 20G. It is thereby possible to obtain white emitted light in a preferred color range of the light emitting device 100. What is called "forward current value" here can be a prescribed forward current value, but it is preferable that this be 1 mA-1000 mA, and more preferably 20 mA-200 mA.

In this specification, "emits red light," "emits green light," and "emits blue light" mean that the emitted light of the first light emitting element 20R, the second light emitting element 20G, the third light emitting element 20B, or the wavelength conversion substance 30 is recognized by the human eye as that light color. That means, for example, that the light emission peak wavelength is in that light color region, but it is also possible to include wavelength elements of outside that light color region. In particular, the emitted light of the phosphor has a broader spectral line width than the semiconductor light emitting elements, and includes more wavelength elements. Because of this, the green to red light emission of the wavelength conversion substance 30 includes the same wavelength elements as the light emission peak wavelength of the first light emitting element 20R and/or the second light emitting element 20G, and it is thereby possible to supplement the radiant flux of the first light emitting element 20R and the second light emitting element 20G.

Also, the content of the wavelength conversion substance 30 of the translucent member 40 is preferably an amount in the range for which the emission light color of the light emitting device 100 is in the white region, and more preferably as small as possible within that range from the perspective of color reproducibility. For the emission light color (x value, y value) of the light emitting device 100, it is preferable that the x value be 0.2-0.4, and the y value be 0.2-0.4, more preferable that the x value be 0.22-0.35, and the y value be 0.22-0.35, and even more preferable that the x value be 0.25-0.32, and the y value be 0.23-0.33. This color (x value, y value) conforms to the xyz color system of the International Commission on Illumination (CIE).

Following, a detailed description is given of preferred modes of the light emitting device 100.

At the same forward current value, when the radiant flux of the third light emitting element 20B is greater than the radiant flux of the second light emitting element 20G, and the radiant flux of the second light emitting element 20G is greater than the radiant flux of the first light emitting element 20R, the wavelength conversion substance 30 is a combination of the phosphor 30R that emits red light and the phosphor 30G that emits green light as shown in FIG. 1B, or is the phosphor 30R that emits red light or preferably is the phosphor 30Y that emits yellow light as shown in FIG. 1C. The radiant flux of the first light emitting element 20R, or the first light emitting element 20R and the second light emitting element 20G are thereby supplemented, and it is easier to balance the radiant flux of the colors of red, green, and blue of the light emitting device 100.

At the same forward current value, when the radiant flux of the third light emitting element 20B is greater than the radiant flux of the first light emitting element 20R, and the radiant flux of the first light emitting element 20R is greater than the radiant flux of the second light emitting element 20G, the wavelength conversion substance 30 is a combination of the phosphor 30R that emits red light and the phosphor 30G that emits green light as shown in FIG. 1B, or is the phosphor 30G that emits green light or preferably is the phosphor 30Y that emits yellow light as shown in FIG. 1C. The radiant flux of the second light emitting element 20G, or the first light emitting element 20R and the second light emitting element 20G are thereby supplemented, and it is easier to balance the radiant flux of the colors of red, green, and blue of the light emitting device 100.

As shown in FIG. 1A to 1C, it is preferable that the first light emitting element 20R, the third light emitting element 20B, and the second light emitting element 20G be juxtaposed in this noted order. In this way, by having the third light emitting element 20B that emits the excitation light of the wavelength conversion substance 30 be arranged between the first light emitting element 20R and the second light emitting element 20G, deviation of the light distribution of each color of red, green, and blue is suppressed, and it is easy to obtain emitted light with little color irregularity. Here, "juxtaposed" means that the first light emitting element 20R, the second light emitting element 20G, and the third light emitting element 20B are arranged in sequence in a first direction seen from the top view (with this embodiment, the top view lengthwise direction of the base 10). At this time, the positions of the first light emitting element 20R, the second light emitting element 20G, and the third light emitting element 20B (defined by the center of each light emitting element) in a second direction perpendicular to the first direction in the top view (with this embodiment, the top view short direction of the base 10) can be different, but it is most preferable that they be on the same straight line.

As shown in FIG. 1A to 1D, it is preferable that the first light emitting element 20R be mounted on the first lead electrode 11a, and that the second light emitting element 20G and the third light emitting element 20B be mounted on the second lead electrode 11c. With the first light emitting element 20R, there are many elements which have an opposite facing electrode structure by which a positive-negative electrode pair are each provided on opposing surfaces to each other. Elements that have the opposite facing electrode structure have one of the positive-negative electrode pair connected with the lead electrode via the electrically conductive adhesive member 65. Because of that, by having the lead electrode on which the first light emitting element 20R is mounted and the lead electrode on which the second light emitting element 20G and the third light emitting element 20B are mounted be different, there is an advantage for heat dissipation of each light emitting element. It is also easy to form the light emitting device 100 to be small in size. Even when there are two lead electrodes, it is possible to mount the first light emitting element 20R, the second light emitting element 20G, and the third light emitting element 20B all on one lead electrode connected in series. Also, using three lead electrodes, if each of the first light emitting element 20R, the second light emitting element 20G, and the third light emitting element 20B is individually mounted on a separate lead electrode, it is even more advantageous for the heat dissipation of each light emitting element.

As shown in FIG. 1A to 1C, the light emitting device is provided with only one of the first light emitting element 20R, the second light emitting element 20G, and the third light emitting element 20B. It is thereby possible to have a simple configuration for electrically connecting the first light emitting element 20R, the second light emitting element 20G, and the third light emitting element 20B, and thus it is easy to form the light emitting device 100 to be small in size. Also, as shown in FIG. 1D, there are two external connection terminals for the light emitting device 100, and both of those are used for power feeding to the first light emitting element 20R, the second light emitting element 20G, and the third light emitting element 20B. It is thereby possible to have a simple, small sized configuration for the light emitting device 100. The number of external connection terminals for power feeding of the light emitting device is not limited to being two, and can be selected as appropriate considering the arrangement and/or the electrical connection of the first light emitting element 20R, the second light emitting element 20G, and the third light emitting element 20B, and can be three, for example.

Embodiment 2

Figure 2A:
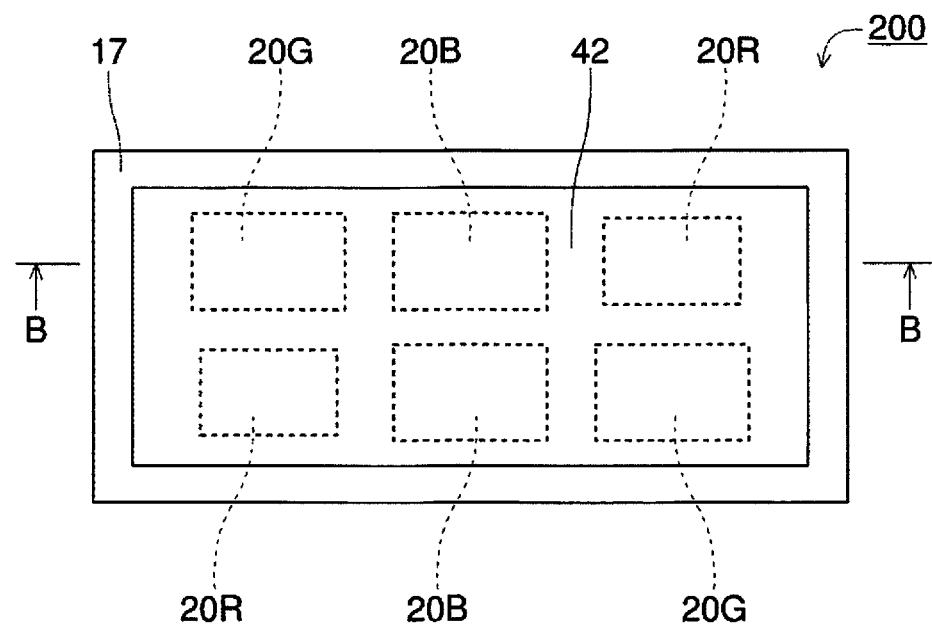
FIG. 2A is a schematic top view of the light emitting device of an embodiment 2 of the present invention.
Figure 2B:
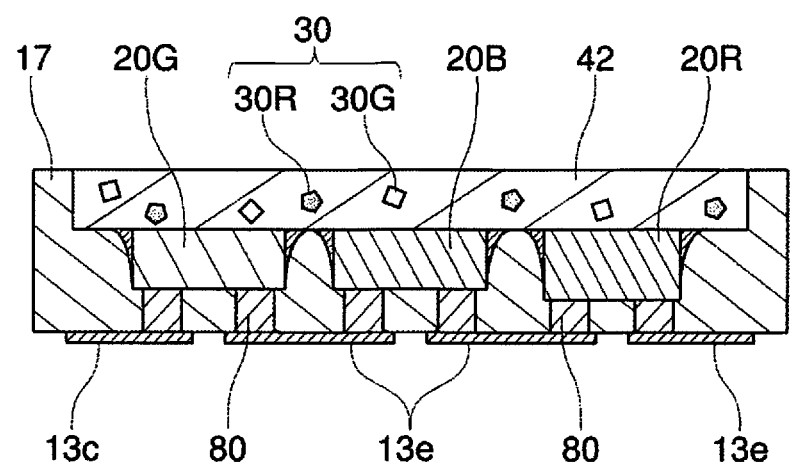
FIG. 2B is a schematic cross section view of the light emitting device taken along a line B-B of FIG. 2A.
Figure 2C:
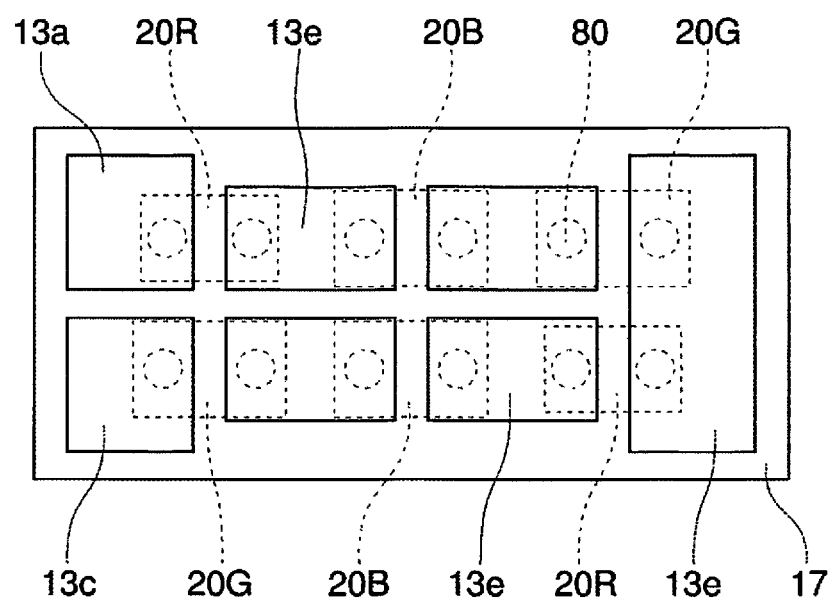
FIG. 2C is a schematic bottom view of the light emitting device of the embodiment 2 of the present invention.

FIG. 2A is a schematic top view of a light emitting device 200 of embodiment 2. FIG. 2B is a schematic cross section view of cross section B-B of FIG. 2A. FIG. 2C is a schematic bottom view of the light emitting device 200.

As shown in FIG. 2A to 2C, the light emitting device 200 of embodiment 2 is also provided with a first light emitting element 20R for emitting red light, a second light emitting element 20G for emitting green light, a third light emitting element 20B for emitting blue light, and a translucent member 42. The first light emitting element 20R, the second light emitting element 20G, and the third light emitting element 20B are connected in series. The translucent member 42 covers the first light emitting element 20R, the second light emitting element 20G, and the third light emitting element 20B. The translucent member 42 includes the wavelength conversion substance 30 that absorbs light of the third light emitting element 20B and emits light. Also, the wavelength conversion substance 30 is a phosphor that emits from green to red light. At the same forward current value, the radiant flux of the third light emitting element 20B is greater than the radiant flux of the first light emitting element 20R, and is greater than the radiant flux of the second light emitting element 20G.

To describe in further detail, the light emitting device 200 is not provided with the kind of base 10 in embodiment 1. The light emitting device 200 is a surface mount type light emitting diode that is also called a "chip size package (CSP) type." Each of the first light emitting element 20R, the second light emitting element 20G, and the third light emitting element 20B is a flip-chip mounting type element. Connected respectively to the positive-negative electrode pairs provided on the bottom surface of the first light emitting element 20R, the second light emitting element 20G, and the third light emitting element 20B, are a pair of bump electrodes 80. Bonded on the top surface of the first light emitting element 20R, the second light emitting element 20G, and the third light emitting element 20B is one flat plate shaped (sheet shaped) translucent member 42. The wavelength conversion substance 30 comprises a combination of the phosphor 30R that emits red light and the phosphor 30G that emits green light. A resin molded body 17 covers the side surface and bottom surface of the first light emitting element 20R, the second light emitting element 20G, and the third light emitting element 20B, the side surface of the translucent member 42, as well as the side surface of the bump electrodes 80. On the bottom surface of the resin molded body 17, connected to each bump electrode 80, formed are one first wiring film 13a, one second wiring film 13c, and a plurality of third wiring films 13e. Also, the first light emitting element 20R and the third light emitting element 20B, as well as the second light emitting element 20G and the third light emitting element 20B are connected in series to each other using the third wiring films 13e. The first light emitting element 20R is connected to the first wiring film 13a that becomes the positive electrode terminal via the bump electrode 80. The second light emitting element 20G is connected to the second wiring film 13c that becomes the negative electrode terminal via the bump electrode 80.

The light emitting device 200 having such a configuration also has very excellent color reproducibility, with a minimum of two external connection terminals for power feeding being sufficient.

As shown in FIGS. 2A and 2C, with the light emitting device 200, each of the first light emitting element 20R, the second light emitting element 20G, and the third light emitting element 20B is configured with two elements. In this way, each of the first light emitting element 20R, the second light emitting element 20G, and the third light emitting element 20B is not limited to only one element, but can also be configured using a plurality of elements. Specifically, even if at least one among the first light emitting element 20R, the second light emitting element 20G, and the third light emitting element 20B is configured with a plurality of elements, the first light emitting element 20R (group), the second light emitting element 20G (group), and the third light emitting element 20B (group) can be connected in series as a whole. Also, in that case, the connection between the plurality of elements configuring one group can be connected in series or can be connected in parallel. Radiant flux can be thought of as the sum total radiant flux of all the elements configuring one group. In this way, by configuring at least one of the first light emitting element 20R, the second light emitting element 20G, and the third light emitting element 20B using a plurality of elements, and by devising the arrangement, bias of the light distribution of each color, red, green, and blue, is further suppressed, and it is easier to obtain emitted light with little color irregularity. With this embodiment 2, as the matrix arrangement from the top view, in the first row, the second light emitting element 20G, the third light emitting element 20B, and the first light emitting element 20R are juxtaposed in this noted sequence from the left side, and in the second row, the first light emitting element 20R, the third light emitting element 20B, and the second light emitting element 20G are juxtaposed in this noted sequence from the left side.

As shown in FIGS. 2B and 2C, there are two external connection terminals for power feeding with the light emitting device 200, the first wiring film 13a and the second wiring film 13c. The third wiring film 13e can be not used as the external connection terminal, or can be used as the external connection terminal for heat dissipation and/or for solder reinforcement. In this way, the light emitting device can be provided with an external connection terminal for other than power feeding. By arranging this kind of external connection terminal other than for power feeding, it is possible to adjust the mounting orientation of the light emitting device.

Hereafter, each constitutional element of the light emitting device of an embodiment of the present invention is explained.

Light Emitting Device 100, 200

The light emitting devices 100, 200 are light emitting diodes (LED) for example. By arranging an external connection terminal, the light emitting devices 100, 200 can be a top surface light emitting type (also called "top view type"), and can be a side surface light emitting type (also called "side view type"). The top surface light emitting type light emitting device has the mounting direction and the principle emission light direction in parallel to each other. The side surface light emitting type light emitting device has the mounting direction and the principal light emitting direction perpendicular to each other. The light emitting devices 100, 200 of the abovementioned embodiments 1 and 2 are top surface light emitting types, with downward being the mounting direction. The top view shape of the light emitting devices 100, 200 can be selected as appropriate, but a rectangular shape is preferable for mass production. A square shape is also acceptable, but considering the arrangement of the first light emitting element 20R, the second light emitting element 20G, and the third light emitting element 20B, a long shape having a lengthwise direction and a short direction is preferable. In that case, it is better that the juxtaposition direction of the first light emitting element 20R, the second light emitting element 20G, and the third light emitting element 20B be the lengthwise direction.

Base 10

The base 10 is primarily a package or a wiring substrate. The base 10 can have a recess for housing the first light emitting element 20R, the second light emitting element 20G, and the third light emitting element 20B, or can be a flat plate shape. Examples of the top view shape of the recess include a rectangle, a rectangle with rounded corners, a circle, an oval, etc. Among these, the top view shape of the recess is preferably rectangular or rectangular with rounded corners, because the recess opening can be more easily provided to be large, making it is easier to extract the light of the light emitting element and the wavelength conversion substance efficiently. The side wall surface of the recess is preferably inclined (including a curve) so that the opening diameter is larger facing from the bottom surface to the opening side in order to have efficient extraction of the light of the first light emitting element 20R, the second light emitting element 20G, the third light emitting element 20B, and the wavelength conversion substance 30. The angle of inclination of the side wall surface of the recess can be selected as appropriate, but it is preferable to be 95°-135° from the recess bottom surface, and more preferably 100°-120°. The depth of the recess can be selected as appropriate, but is preferably 0.1 mm-1 mm, and more preferably 0.25 mm-0.5 mm.

First Lead Electrode 11a, Second Lead Electrode 11c

For the first lead electrode 11a and the second lead electrode 11c, it is possible to use metal members capable of electrical conduction (what are called "metals" here include alloys) for the first light emitting element 20R, the second light emitting element 20G, and the third light emitting element 20B. Specific examples include copper, aluminum, gold, silver, palladium, chrome, titanium, tungsten, iron, nickel, cobalt, molybdenum, or alloys of these, or phosphor bronze or copper-iron alloys. The various shapes of the first lead electrode 11a and the second lead electrode 11c can be formed by implementing processing such as pressing, rolling, etching, etc., on the abovementioned metal plate material (base body). It is also possible to provide a light reflective film such as of silver, aluminum, rhodium, or alloys of these, etc., on the surface, and among these, silver or a silver alloy which are excellent in terms of light reflection are preferable. The first lead electrode 11a and the second lead electrode 11c can also be wiring of a wiring substrate. The first lead electrode 11a and the second lead electrode 11c in this case can be formed using plating, sputtering, vapor deposition, printing, a co-fire method, a post-fire method, etc.

(First Wiring Film 13a, Second Wiring Film 13c, and Third Wiring Film 13e) The first wiring film 13a, the second wiring film 13c, and the third wiring film 13e can use the same metal member as the aforementioned first lead electrode 11a and the second lead electrode 11c. The first wiring film 13a, the second wiring film 13c, and the third wiring film 13e can be single layer films, but it is preferable that they be multi-layer films. Examples of a multi-layer film include nickel/gold, nickel/palladium/gold, nickel/palladium/gold/silver, etc. The first wiring film 13a, the second wiring film 13c, and the third wiring film 13e can be formed by plating, sputtering, vapor deposition, printing, etc.

Resin Molded Body 15, 17

For the base material of the resin molded body 15, 17, it is possible to use a thermosetting resin or a thermoplastic resin. The resins shown hereafter include their modified resins (including hybrid resins) as well. Examples of the thermosetting resin include epoxy resin, silicone resin, polybismaleimide triazine resin, polyimide resin, polyurethane resin, unsaturated polyester resin, etc. Among these, any one of epoxy resin, silicone resin and unsaturated polyester is preferable. Examples of the thermoplastic resin include aliphatic polyamide resin, semi-aromatic polyamide resin, aromatic polyphthalamide resin, polycyclohexylenedimethylene terephthalate, polyethylene terephthalate, polycyclohexane terephthalate, liquid crystal polymer, polycarbonate resin, etc. Among these, any one of aromatic polyphthalamide resin, aliphatic polyamide resin, polycyclohexane terephthalate, and polycyclohexylenedimethylene terephthalate is preferable. In these base materials, as a filler (including reinforcing fiber) or coloring pigment, it is possible to mix in particles or fibers of glass, silicon oxide, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chromium oxide, manganese oxide, carbon black, etc. Among these, it is preferable to use silicon oxide as a filler and titanium oxide or zinc oxide as a coloring pigment (reflecting material). The content of the color pigment in the resin molded bodies 15, 17 can be selected as appropriate, and it is better to have more from the perspective of the optical function of the resin molded bodies 15, 17, but considering the effect on flowability, it is preferably 20 wt %-70 wt %, and more preferably 30 wt %-60 wt %. "wt %" means weight percent, and represents the ratio of the weight of the concerned material to the total weight of the overall structure material. For the resin molded bodies 15, 17, from the perspective of light extraction efficiency toward the front, the reflection rate of the light emission peak wavelength of the third light emitting element 20B is preferably 70% or greater, more preferably 80% or greater, and even more preferably 90% or greater. Furthermore, it is preferable that the resin molded bodies 15, 17 be white. The resin molded bodies 15, 17 go through a state having flowability, in other words, a liquid state (including a sol form or slurry form) before curing or hardening. The resin molded bodies 15, 17 can be formed using transfer molding or injection molding. As the base body material when the base 10 is a wiring substrate, examples include ceramic containing aluminum oxide, aluminum nitride, or a mixture of these, or a resin such as epoxy resin, BT resin, polyimide resin, etc., or fiber reinforced resins of these (reinforcing fiber is glass, etc.).

First Light Emitting Element 20R, Second Light Emitting Element 20G, Third Light Emitting Element 20B For the first light emitting element 20R, the second light emitting element 20G, and the third light emitting element 20B, it is possible to use a semiconductor light emitting element such as a light emitting diode element, etc. The first light emitting element 20R, the second light emitting element 20G, and the third light emitting element 20B are acceptable provided they have an element structure configured by various semiconductors, and have a positive-negative electrode pair. The first light emitting element 20R is preferably a gallium arsenide or a gallium phosphide type semiconductor light emitting element. The gallium arsenide or gallium phosphide semiconductor can have high efficiency light emission of long wavelengths in the visible range. The light emission peak wavelength of the first light emitting element 20R can be selected as appropriate, but is preferably 620 nm-660 nm, and more preferably 620 nm-640 nm. There are many cases when the size of the first light emitting element 20R in the top view is smaller than the second light emitting element 20G and the third light emitting element 20B. Also, the forward voltage of the first light emitting element 20R is often smaller than the forward voltage of the second light emitting element 20G and the forward voltage of the third light emitting element 20B at the same forward current value. The second light emitting element 20G and the third light emitting element 20B are preferably gallium nitride type semiconductor ($In_xAl_yGa_{1-x-y}N$, 0<x, 0<y, x+y<1) light emitting elements. The gallium nitride type semiconductor can have high efficiency light emission of short wavelengths in the visible range. The light emission peak wavelength of the second light emitting element 20G can be selected as appropriate, but is preferably 520 nm-560 nm, and more preferably 540 nm-560 nm. The light emission peak wavelength of the third light emitting element 20B can be selected as appropriate, but is preferably 435 nm-465 nm, and more preferably 440 nm-460 nm. The first light emitting element 20R, the second light emitting element 20G, and the third light emitting element 20B have a substrate in most cases. The substrate is preferably translucent, but is not limited to this. As the base material of the substrate, examples' include sapphire, spinel, gallium nitride, aluminum nitride, silicon, silicon carbide, gallium arsenide, gallium phosphide, indium phosphide, zinc sulfide, zinc oxide, zinc selenide, etc. With the first light emitting element 20R, the second light emitting element 20G, and the third light emitting element 20B, when the positive-negative electrode pair is provided on the same surface side, it is possible to use "face-up mounting" whereby each electrode is connected with the lead electrode by a wire. It is also possible to use "face-down (flip-chip) mounting" whereby each electrode is adhered to the lead electrode by an electrically conductive adhesive member. In the case of an opposite facing electrode structure with which the positive-negative electrode pairs are each provided on mutually opposing surfaces, the bottom surface electrode is adhered to the lead electrode using an electrically conductive adhesive member, and the top surface electrode is connected with the lead electrode using a wire.

Wavelength Conversion Substance 30

The wavelength conversion substance 30 absorbs at least a portion of primary light emitted by the third light emitting element 20B, and emits secondary light of a different wavelength from the primary light. It is thereby possible to have a light emitting device that emits mixed light of visible wavelength primary light and secondary light (white light, for example). For the wavelength conversion substance 30, among the specific examples shown hereafter, it is possible to use just one type, or a combination of two or more types.

First Phosphor 30R

The first phosphor 30R emits red light. The light emission peak wavelength of the first phosphor 30R can be selected as appropriate, but it is preferably 620 nm-660 nm, and more preferably 620 nm-640 nm. Specific examples include nitrogen-containing calcium aluminosilicate (CASN or SCASN) type phosphors (e.g. (Sr, Ca)AlSiN$_3$:Eu), etc. Also, with manganese-activated fluoride phosphor (phosphor represented by the general formula A$_2$[M$_{1-a}$Mn$_a$F$_6$] (where in the abovementioned general formula, A is at least one type selected from a group comprising K, Li, Na, Rb, Cs, and NH$_4$, M is at least one type of element selected from a group comprising group 4 elements and group 14 elements, and a satisfies 0<a<0.2)), light emission is possible in a relatively narrow spectral line width, so this is preferable from the perspective of color reproducibility. A representative example of this manganese-activated fluoride phosphor is a phosphor of manganese-activated fluoride potassium silicate (e.g. K$_2$SiF$_6$:Mn).

Second Phosphor 30G

The second phosphor 30G emits green light. The light emission peak wavelength of the second phosphor 30G can be selected as appropriate, but it is preferably 520 nm-560 nm, and more preferably 540 nm-560 nm. Specific examples include an yttrium aluminum garnet based phosphor (for example, Y$_3$(Al, Ga)$_5$O$_{12}$:Ce), a lutetium aluminum garnet based phosphor (for example, Lu$_3$(Al, Ga)$_5$O$_{12}$:Ce), a terbium aluminum garnet based phosphor (for example, Tb$_3$(Al, Ca)$_5$O$_{12}$:Ce), a silicate based phosphor (for example, (Ba, Sr)$_2$SiO$_4$:Eu), a chlorosilicate based phosphor (for example, Ca$_8$Mg(SiO$_4$)$_4$Cl$_2$:Eu), a fi sialon based phosphor (for example, Si$_{6-z}$Al$_z$O$_z$N$_{8-z}$:Eu (0<z<4.2)), an SGS based phosphor (for example, SrGa$_2$S$_4$:Eu), etc.

Third Phosphor 30Y

The third phosphor 30Y emits yellow light. Specific examples include an α-sialon-based phosphor (for example, M$_z$(Si, Al)$_{12}$(O, N)$_{16}$ (0<z≤2, M is Li, Mg, Ca, Y and a lanthanide element other than La and Ce), etc. In addition, there is also a phosphor that emits yellow light in the second phosphor 30G. Also, for example, by substituting a portion of Y with Gd for an yttrium aluminum garnet based phosphor, it is possible to shift the emission peak wavelength to the longer wavelength side, and to emit yellow light. Also, among these, there are phosphors that can emit orange light.

Translucent Member 40, 42

The translucent members 40, 42 are members that cover the first light emitting element 20R, the second light emitting element 20G, and the third light emitting element 20B, and transmit the light emitted from these to outside the device. The translucent members 40, 42 have electrical insulation, and can be members having translucency in relation to light emitted by the first light emitting element 20R, the second light emitting element 20G, the third light emitting element 20B, and the wavelength conversion substance 30 (the light transmissivity to the light emission peak wavelength of the third light emitting element 20B is preferably 60% or greater, more preferably 70% or greater, and even more preferably 80% or greater). The translucent member 40 of embodiment 1 is a sealing member that seals the first light emitting element 20R, the second light emitting element 20G, and the third light emitting element 20B, and protects them from dust, moisture, external force, etc.

Examples of the base material of the translucent members 40, 42 include a silicone resin, an epoxy resin, a phenol resin, a polycarbonate resin, an acrylic resin, a TPX resin, a polynorbornene resin, or a modified resin of these (including a hybrid resin). Among these, the silicone resin (silicone resin and modified resin thereof) is preferable because it has a low elastic modulus and is particularly excellent in heat resistance and light resistance. Also, silicone based resins containing a phenyl group (methyl-phenyl silicone based resin to diphenyl silicone based resin) are more preferable among silicone resins because of their relatively high heat resistance and gas barrier properties.

Examples of the filler for the translucent members 40, 42 include silicon oxide, aluminum oxide, zirconium oxide, zinc oxide, etc. For the filler for the translucent members 40, 42, it is possible to use one type of these alone, or a combination of two or more of these. In particular, it is preferable to use silicon oxide as the coefficient of thermal expansion reducing agent for the translucent members 40, 42. The shape of the filler for the translucent members 40, 42 can be selected as appropriate, and an amorphous form (granular type) is acceptable, but from the perspective of flowability, a sphere shape is preferable. The content of the filler in the translucent members 40, 42 can be selected as appropriate, and this can be determined as appropriate considering the coefficient of thermal expansion, flowability, etc., of the translucent members 40, 42, but it is preferably 0.1 wt %-50 wt %, and more preferably 1 wt %-30 wt %. Also, as the filler for the translucent members 40, 42, by using nanoparticles (particles with particle diameter of 1 nm-100 nm), it is possible to increase scattering of the blue light of the third light emitting element 20B (including Rayleigh scattering), and to reduce the usage amount of the wavelength conversion substance 30. As this nanoparticle filler, for example, silicon oxide or zirconium oxide is preferable.

Wire 50

The wire 50 is a conducting wire for connecting the electrodes of the first light emitting element 20R, the second light emitting element 20G, and the third light emitting element 20B to each other, or the electrodes of these light emitting elements with lead electrodes. The wire 50 can also be used to connect the electrode of the protective element 70 and the lead electrode. In specific terms, it is possible to use metal wire of gold, copper, silver, platinum, aluminum, palladium, or alloys of these ("metal" here includes alloys). In particular, a metal wire or metal alloy wire that is not susceptible to breakage due to stress from the translucent member 40, and which is excellent in terms of thermal resistance, etc., is preferable. Also, to increase light reflection, it is possible to configure at least the surface using silver or a silver alloy. The wire diameter of the wire 50 can be selected as appropriate, but it is preferably 5 μm-50 μm, more preferably 10 μm-40 μm, and even more preferably 15 μm-30 μm.

Adhesive Member 60, 65

The adhesive members 60, 65 are members for adhering the first light emitting element 20R, the second light emitting element 20G, and the third light emitting element 20B to the lead electrodes. The adhesive member 65 can also be used for adhering the protective element 70 to the lead electrode. As the electrically insulating adhesive member 60, an epoxy resin, a silicone resin, a polyimide resin, or a modified resin of these (including a hybrid resin) or the like can be used. As the electrically conductive adhesive member 65, besides an electrically conductive paste of silver, gold, palladium or the like, a tin-bismuth type, a tin-copper type, a tin-silver type, or a gold-tin type solder, etc. can be used.

Protective Member 70

The protective member 70 is an element for protecting the first light emitting element 20R, the second light emitting element 20G, and the third light emitting element 20B from static electricity, high voltage surges, etc. A specific example of the protective element 70 is a Zener diode, for example. The protective element 70 is not absolutely required, but can be provided in accordance with the reliability required for the light emitting device.

Bump Electrode 80

The bump electrode 80 is also called a bump or pillar, etc. The bump electrode 80 can be configured with small metal or alloy pieces. Specific examples include gold, silver, copper, iron, tin, platinum, zinc, nickel, aluminum, tungsten, or alloys of these. Among these, because copper has excellent thermal conductivity and is relatively inexpensive, copper or a copper alloy are especially suitable. Also, gold is also chemically stable with little surface oxidation, and has the property of bonding easily, so gold or gold alloys are also preferable. From the perspective of bondability, the bump electrode 80 may also have a covering film such as gold or silver, etc. on the surface.

WORKING EXAMPLES

Following is a detailed description of a working example of the present invention. It goes without saying that the present invention is not limited to only the working example shown hereafter.

Working Example 1

The light emitting device of working example 1 is an approximately rectangular parallelepiped-shaped top surface light emitting type and surface mount type light emitting diode, which has the structure of the light emitting device 100 of the examples shown in FIGS. 1A, 1B, and 1D.

The base 10 size is vertically 1.4 mm, horizontally 4.0 mm, and thickness 0.6 mm, and is a package configured to have the resin molded body 15 be formed as an integrated unit with the positive-negative pair first and second lead electrodes 11a, 11c. This base 10 is produced by having a processed metal plate (lead frame) made by a plurality of pairs of first and second lead electrodes 11a, 11c being connected vertically and horizontally via a suspension lead be arranged inside a metal mold, injecting the liquid state structural material of the resin molded body 15 and curing that, and after releasing from the mold, cutting (dividing) this.

Each of the first and second lead electrodes 11a, 11c is a plate shaped small piece of copper alloy with maximum thickness 0.2 mm for which silver plating is implemented on the surface. The exposed region of the bottom surface of the first and second lead electrodes 11a, 11c which will be the respective external connection terminals are essentially the same surface as the bottom surface of the resin molded body 15, and configure the bottom surface of the base 10. With each of the first and second lead electrodes 11a, 11c, at four end surfaces of the base 10 (resin molded body 15), the cut suspension lead is exposed.

The resin molded body 15 has a top view external shape of a 1.4 mm vertical by 4.0 mm horizontal rectangle, with a maximum thickness of 0.6 mm, and is made of an epoxy resin containing silicon oxide and titanium oxide. At the top surface of the resin molded body 15, in other words, approximately the center of the top surface of the base 10, with a vertically 1.0 mm and horizontally 3.7 mm rectangular opening with rounded corners in the top view, a recess of depth 0.4 mm is formed. The side wall surface of the recess is an inclined surface forming an angle of 111.3° with the bottom surface of the recess.

On the top surface of the positive electrode side first lead electrode 11a on the recess bottom surface (element mounting surface) of the base 10, the first light emitting element 20R is adhered to the substrate side by the adhesive member 65 made of silver paste. On the top surface of the negative electrode side second lead electrode 11c, the second light emitting element 20G and the third light emitting element 20B have the substrate side adhered by the adhesive member 60 made of dimethyl silicone resin. The first light emitting element 20R is an LED element that is a 320 μm vertical by 320 μm horizontal rectangle in the top view capable of emitting red (at forward current 120 mA, forward voltage 2.1 V, radiant flux 85 mW, light emission peak wavelength approximately 630 nm) light for which element structures of a gallium phosphide type semiconductor are laminated on a gallium phosphide substrate. The second light emitting element 20G is an LED element that is a 650 μm vertical by 650 μm horizontal rectangle in the top view capable of emitting green (at forward current 120 mA, forward voltage 3.1 V, radiant flux 105 mW, light emission peak wavelength approximately 523 nm) light for which element structures of a gallium nitride type semiconductor are laminated on a sapphire substrate. The third light emitting element 20B is an LED element that is a 650 μm vertical by 650 μm horizontal rectangle in the top view capable of emitting blue (at forward current 120 mA, forward voltage 3.0 V, radiant flux 190 mW, light emission peak wavelength approximately 453 nm) light for which element structures of a gallium nitride type semiconductor are laminated on a sapphire substrate. The first light emitting element 20R has the p electrode adhered to the first lead electrode 11a by the adhesive member 65, and the n electrode is connected to the p electrode of the third light emitting element 20B by the wire 50. The third light emitting element 20B has the n electrode connected to the p electrode of the second light emitting element 20G by the wire 50. The second light emitting element 20G has the n electrode connected to the top surface of the negative electrode side second lead electrode 11c by the wire 50. The wire 50 is a gold wire with wire diameter 25 μm.

The translucent member 40 is filled in the recess of the base 10, and covers the first light emitting element 20R, the second light emitting element 20G, and the third light emitting element 20B. The translucent member 40 has methyl phenyl silicone resin as the base material, and contains within that: the wavelength conversion substance 30 comprising the first phosphor 30R of manganese-activated potassium fluorosilicate (light emission peak wavelength approximately 630 nm), and the second phosphor 30G of β sialon (light emission peak wavelength approximately 540 nm); and a silicon oxide filler. The wavelength conversion substance 30 is unevenly distributed to the downward (recess bottom surface) side in the translucent member 40 due to sedimentation. The top surface of the translucent member 40 is approximately the same surface as the top surface of the base 10 (resin molded body 15), and is approximately a flat surface (strictly speaking, a slightly concave surface due to hardening shrinkage). This translucent member 40 is formed by a liquid structural material being dropped inside the recess of the base 10 by a dispenser, etc., and being cured by heating.

The light emitting device of working example 1 configured as noted above is capable of emitting light at color (x, y)=(0.28, 0.28), 88 lm at forward current 120 mA. Also, the light emitting device of this working example 1 can exhibit the same effects as the light emitting device 100 of embodiment 1.

The light emitting device of an embodiment of the present invention can be used for a backlight device of a liquid crystal display, various types of illumination equipment, large scale displays, various types of display devices for advertising or destination guide, etc., projector devices, as well as image reading devices, etc., for digital video cameras, fax machines, copy machines, scanners, etc.

What is claimed is:

1. A light emitting device comprising:
    a first light emitting element configured to emit red light;
    a second light emitting element configured to emit green light;
    a third light emitting element configured to emit blue light; and
    a translucent member covering the first light emitting element, the second light emitting element and the third light emitting element, the translucent member including a wavelength conversion substance configured to absorb the blue light of the third light emitting element and to emit light, wherein
    the first light emitting element, the second light emitting element, and the third light emitting element are connected in series,
    at the same forward current value, a radiant flux of the third light emitting element is greater than a radiant flux of the first light emitting element and a radiant flux of the second light emitting element, and
    the wavelength conversion substance includes a phosphor material configured to emit light having a color between green and red.

2. The light emitting device according to claim 1, wherein
    at the same forward current value, the radiant flux of the second light emitting element is greater than the radiant flux of the first light emitting element, and
    the phosphor material of the wavelength conversion substance includes one of
        a phosphor configured to emit red light,
        a combination of the phosphor configured to emit red light and a phosphor configured to emit green light, and
        a phosphor configured to emit yellow light.

3. The light emitting device according to claim 1, wherein
    at the same forward current value, the radiant flux of the first light emitting element is greater than the radiant flux of the second light emitting element, and
    the phosphor material of the wavelength conversion substance includes one of
        a phosphor configured to emit green light,
        a combination of a phosphor configured to emit red light and the phosphor configured to emit green light, and
        a phosphor configured to emit yellow light.

4. The light emitting device according to claim 2, wherein the phosphor configured to emit red light is a manganese-activated fluoride phosphor.

5. The light emitting device according to claim 3, wherein the phosphor configured to emit red light is a manganese-activated fluoride phosphor.

6. The light emitting device according to claim 1, wherein the third light emitting element is arranged between the first light emitting element and the second light emitting element in a plan view.

7. The light emitting device according to claim 1, further comprising
    a first lead electrode and a second lead electrode, wherein the first light emitting element is mounted on the first lead electrode, and the second light emitting element and the third light emitting element are mounted on the second lead electrode.

* * * * *